United States Patent
Senoo et al.

Patent No.: US 6,544,371 B2
Date of Patent: Apr. 8, 2003

(54) METHOD OF USING A TRANSFER TAPE

(75) Inventors: Hideo Senoo, Kawaguchi (JP); Yoshihisa Mineura, Agatsuma-machi (JP)

(73) Assignee: Lintec Corporation, Tokyo (JP)

( * ) Notice: Subject to any disclaimer, the term of this patent is extended or adjusted under 35 U.S.C. 154(b) by 28 days.

(21) Appl. No.: 09/881,632

(22) Filed: Jun. 14, 2001

(65) Prior Publication Data

US 2002/0028331 A1 Mar. 7, 2002

Related U.S. Application Data

(62) Division of application No. 09/588,452, filed on Jun. 6, 2000, now abandoned.

(30) Foreign Application Priority Data

Jun. 7, 1999 (JP) ............................................. 11-159740

(51) Int. Cl.⁷ ........................ B44C 1/165; B32B 31/00; B32B 15/08; B05D 5/10; H01L 21/52
(52) U.S. Cl. ...................... 156/230; 156/231; 156/238; 156/240; 156/247; 156/277; 156/289; 427/96; 427/146; 427/147; 427/148; 428/41.8; 428/42.1; 428/200; 428/202; 428/343; 428/347; 428/914
(58) Field of Search .................. 156/203, 231, 156/234, 238, 210, 241, 247, 277, 289; 427/146, 147, 148, 96; 428/46.1, 41.7, 41.8, 42.1, 42.2, 42.3, 200, 202, 343, 346, 347, 355 R, 914

(56) References Cited

U.S. PATENT DOCUMENTS

| 4,664,739 | A | * | 5/1987 | Aurichio | 156/344 |
| 4,793,883 | A | * | 12/1988 | Sheyon et al. | 156/235 |
| 4,959,008 | A | * | 9/1990 | Wasulko | 428/40 |
| 4,961,804 | A | * | 10/1990 | Aurichio | 156/248 |
| 5,032,438 | A | * | 7/1991 | Sakumoto et al. | 428/40 |
| 5,110,388 | A | | 5/1992 | Komiyama et al. | |
| 5,118,567 | A | | 6/1992 | Komiyama et al. | |
| 5,158,818 | A | * | 10/1992 | Aurichio | 428/40 |
| 5,449,540 | A | | 9/1995 | Calhoun et al. | |
| 6,136,128 | A | * | 10/2000 | Chung | 156/235 |
| 6,428,650 | B1 | * | 8/2002 | Chung | 156/250 |
| 6,432,253 | B1 | * | 8/2002 | Chung | 156/295 |

FOREIGN PATENT DOCUMENTS

JP (1988) 2-032181 3/1990

* cited by examiner

Primary Examiner—J. A. Lorengo
(74) Attorney, Agent, or Firm—Webb Ziesenheim Logsdon Orkin & Hanson, P.C.

(57) ABSTRACT

A method of securing semiconductor chips comprises the steps of: sticking semiconductor chips at their backs to a transfer tape having an adhesive superimposed thereon at spaced intervals; peeling the semiconductor chips from the transfer tape such that the adhesive is transferred onto the backs of the semiconductor chips; and securing the semiconductor chips by way of the adhesive onto a substrate. The method also includes variations such as sticking the transfer tape to a substrate at predetermined sites for securing semiconductor chips and then peeling the base material of the transfer tape to transfer the adhesive to the predetermined sites on the substrate, followed by securing the semiconductor chips thereto.

2 Claims, 3 Drawing Sheets

METHOD OF USING A TRANSFER TAPE

CROSS-REFERENCE TO RELATED APPLICATIONS

This is a divisional of co-pending U.S. patent application Ser. No. 09/588,452 filed Jun. 6, 2000 now abandoned.

FIELD OF THE INVENTION

The present invention relates to a transfer tape which is suitable for transferring an adhesive to an extremely small item such as a semiconductor chip or to portions of an extremely small area such as sites of a lead frame predetermined for mounting IC chips.

BACKGROUND OF THE INVENTION

When securing an extremely small electronic component such as a semiconductor chip onto a substrate such as a circuit board or a lead frame, it is common practice to employ the method known as the "dispenser method" or the method of using a film adhesive.

The dispenser method, a given amount of liquid adhesive is applied to sites of a substrate which are predetermined for securing semiconductor chips with the use of a dispenser, followed by the compression bonding/fixing of semiconductor chips thereonto. However, this dispenser method has drawbacks in that controlling the amount of adhesive discharged is difficult, thereby causing the adhesive amount to be uneven, bringing about a variation of quality, and in that a bleeding phenomenon occurs in the curing of the liquid adhesive.

In the method of using a film adhesive, a film adhesive cut into substantially the same shape as that of the chip is stuck to sites of a substrate predetermined for securing semiconductor chips in advance, or a film adhesive cut into substantially the same shape as that of the chip is stuck to chips, and the chips are secured through the film adhesive to the substrate. However, in this method, it is required to cut the film adhesive into substantially the same shape as that of the chip in advance, so that the method is time-consuming and, when a wide variety of chips are employed, timely preparations cannot be effected. Further, the work for sticking the film adhesive of the same extremely small size as that of the chip is requisite, so that the method is very laborious.

The present invention overcomes the above-described shortcomings encountered in the prior art and provides a transfer tape which enables transferring a given amount of adhesive to an extremely small item such as a semiconductor chip or to portions of an extremely small area such as sites of a lead frame predetermined for mounting IC chips by simple operation.

SUMMARY OF THE INVENTION

The transfer tape of the present invention comprises a base material and, superimposed thereon with intervals, an adhesive.

The terminology "with intervals" used herein preferably means that the adhesive is in the form of a pattern of independent constituents whose respective areas are substantially equal to each other, the area per pattern constituent being in the range of 0.01 to 10% of the area of the underside of an object onto which the adhesive is transferred, and having an average shortest distance between pattern constituents in the range of 0.5 to 10% of a maximum length of the object's underside.

The first method of securing semiconductor chips according to the present invention comprises:

sticking semiconductor chips to be secured at their backs to the above transfer tape, peeling the semiconductor chips from the transfer tape in such a manner that the adhesive is transferred onto the backs of the semiconductor chips, and securing the semiconductor chips through the adhesive onto a substrate.

The second method of securing semiconductor chips according to the present invention comprises:

sticking the above transfer tape to sites of a substrate which have been predetermined for securing semiconductor chips, peeling the base material of the transfer tape in such a manner that the adhesive is transferred onto the substrate sites predetermined for securing semiconductor chips, and securing semiconductor chips through the adhesive onto the substrate.

DETAILED DESCRIPTION OF THE INVENTION

The present invention will be described in greater detail below with reference to the appended drawings.

Figure 1:
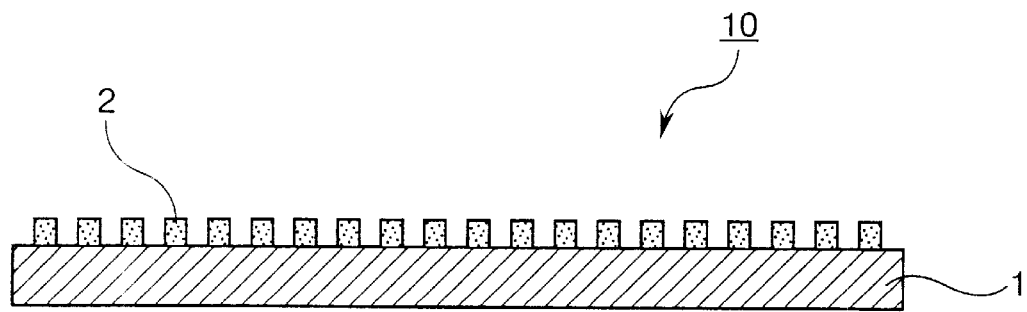
FIG. 1 is a sectional view of the transfer tape of the present invention.

Referring to FIG. 1, the transfer tape 10 of the present invention comprises base material 1 and, superimposed thereon with intervals, adhesive 2.

A variety of thin-layer items commonly employed as a base material of a pressure sensitive adhesive tape or the like can be used without any particular limitation as the base material 1. For example, use can be made of any of paper, metal foils and films of synthetic resins such as polyethylene terephthalate, polyethylene, polystyrene, polypropylene, nylons, urethanes, polyvinylidene chloride and polyvinyl chloride. Also, laminates of these can be used as the base material 1.

In the present invention, if necessary, the surface of this base material may be furnished with release treatment with the use of, for example, a silicone resin or an alkyd resin to thereby enable use as a release sheet in order to facilitate the peeling of the adhesive from the base material surface and hence the transfer thereof to the chip, etc.

It is preferred that the surface tension of this base material 1 be not greater than 40 dyne/cm, especially in the range of 20 to 40 dyne/cm, and still especially in the range of 30 to 35 dyne/cm.

When the surface tension of the base material 1 is greater than 40 dyne/cm, the adherence of the adhesive to the base material 1 is so high that the transfer thereof to an object may be disenabled. On the other hand, when the surface tension is less than 20 dyne/cm, coating the base material 1 with the adhesive with intervals may be infeasible.

The thickness of this base material 1 is generally in the range of 5 to 300 $\mu$m, preferably 10 to 200 $\mu$m.

The adhesive 2 is superimposed with intervals on the base material 1.

A variety of-common adhesives can be used as the adhesive 2. This adhesive, although not limited at all, can be, for example, any of rubber, acrylic, silicone and polyvinyl ether based pressure sensitive adhesives; epoxy, urethane and phenol based reaction-curable adhesives; hot melt adhesives; and thermosetting or thermoplastic polyimide adhesives.

Further, hardenable pressure sensitive adhesives can be used as the adhesive 2. The hardenable pressure sensitive adhesives have pressure-sensitive adherence and can be cured by appropriate means. Suitable hardenable pressure sensitive adhesives are disclosed in, for example, Japanese Patent Laid-open Publication No. 2(1990)-32181.

The above adhesive 2, if necessary, maybe loaded with, for example, a powdery metal or powdery carbon black to thereby render the adhesive conductive.

The coating thickness of this adhesive 2, although depending on the property of the material thereof, is generally in the range of about 3 to 100 μm, preferably about 10 to 50 μm.

In the present invention, the above adhesive 2 is formed with intervals on the base material 1. The terminology "with intervals" used herein means that, referring to FIG. 2, the adhesive is in the form of a pattern of extremely small insular constituents, which are separate from (independent of) each other. Although the shape of each of the pattern constituents is not particularly limited and may be circular, elliptic, square, rectangular or triangular, it is preferred that all the pattern constituents have the same shape and substantially the same area.

The area of each of the pattern constituents of the adhesive is smaller than the area of the underside of object 20 onto which the adhesive is transferred. It is preferably in the range of 0.01 to 10%, still preferably 0.1 to 7%, and yet still preferably 0.5 to 5%, of the area of the underside of the object 20.

Figure 2:
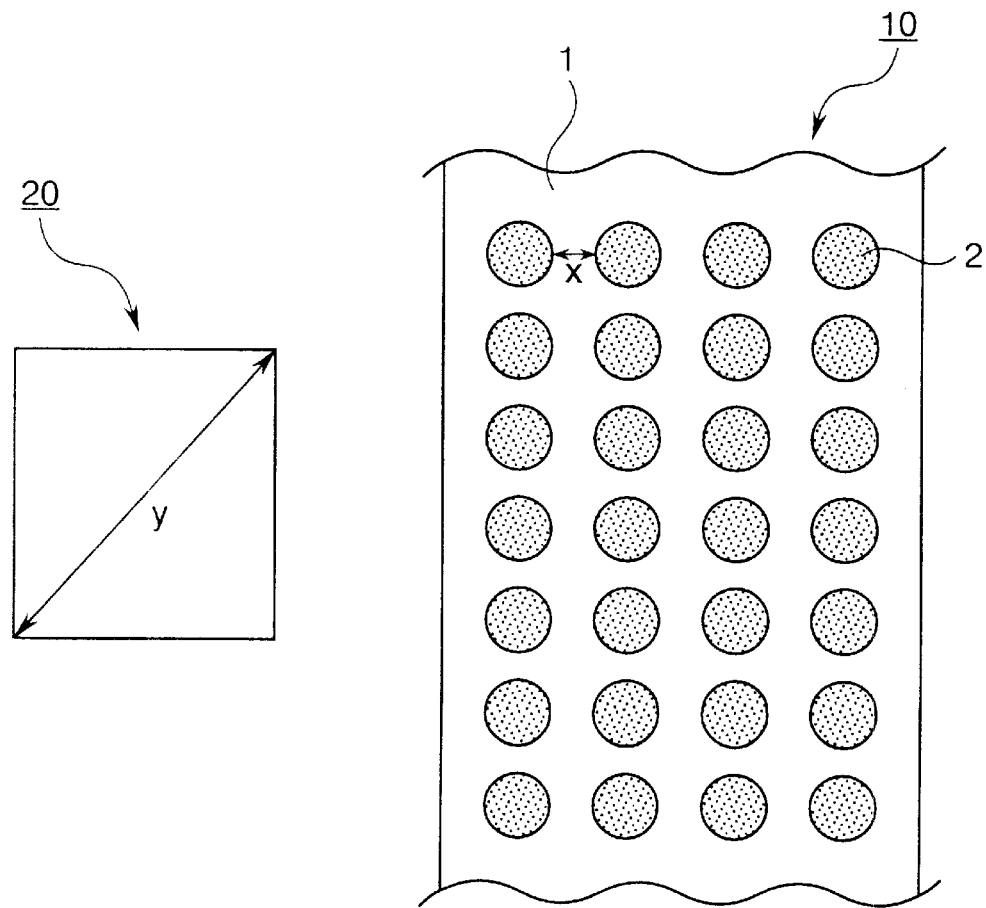
FIG. 2 shows a plan of the transfer tape of the present invention together with an object onto which the adhesive is transferred.

The distance between pattern constituents is smaller than maximum length y of the underside of the object 20. It is preferably in the range of 0.5 to 10%, still preferably 1 to 8%, and optimally 3 to 5%, of the maximum length y of the underside of the object 20. Referring to FIG. 2, the terminology "distance between pattern constituents" used herein means a value calculated as an average of the shortest distances x between neighboring pattern constituents.

Therefore, if, for example, an object of 1 cm square is the object 20 onto which the adhesive is transferred, the adhesive is formed on the base material 1 in the form of a pattern of constituents separate from (independent of) each other, the area of each of the constituents would be in the range of 0.0001 to 0.1 cm$^2$, preferably 0.01 to 0.08 cm$^2$, and the shortest distance between neighboring constituents being in the range of 0.07 to 1.4 mm, preferably 0.14 to 1.13 mm.

When the area per pattern constituent is smaller than 0.01% of the area of the underside of the object and when the distance between neighboring pattern constituents is larger than 10% of the maximum length of the underside of the object, poor adhesive strength may be experienced. On the other hand, when the area per pattern constituent is larger than 10% of the area of the underside of the object and when the distance between neighboring pattern constituents is smaller than 0.5% of the maximum length of the underside of the object, bleed-out of the adhesive may occur.

This adhesive pattern can be formed on the base material 1 by, for example, the technique such as screen printing.

Figure 3:
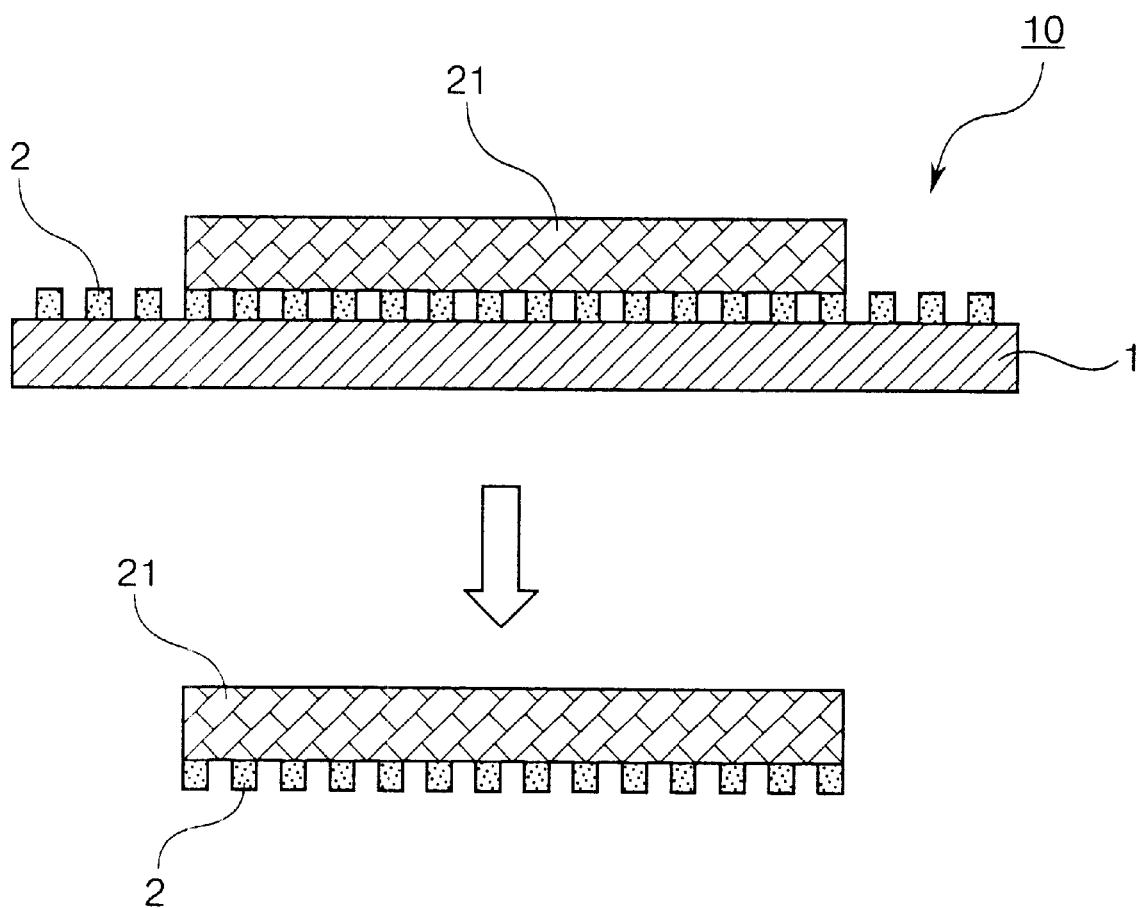
FIG. 3 shows major steps of the first method of securing semiconductor chips according to the present invention.

Referring now to FIG. 3, the method of using the transfer tape of the present invention will be described with reference to an instance in which the adhesive is transferred to the backs of semiconductor chips as an object and the semiconductor chips are secured through the adhesive to a given substrate.

Specifically, in the first method of securing semiconductor chips according to the present invention, the backs of semiconductor chips 21 to be secured are disposed on the adhesive coated side of transfer tape 10, and slight pressure is applied thereto so that the semiconductor chips 21 are temporarily stuck to the transfer tape 10. Thereafter, the semiconductor chips 21 are peeled from the transfer tape 10. The peeling is performed in such a manner that the adhesive 2 is transferred onto the backs of the semiconductor chips 21. Therefore, the semiconductor chips 21 can be secured through the adhesive 2 to given sites of a substrate (not shown).

In the present invention described above, laborious operations commonly conducted in the prior art, such as application of liquid adhesives and cutting and sticking of film adhesives, can be avoided. Further, the adhesive can be applied to the backs of semiconductor chips at a uniform thickness, which is neither too much nor too little. Thus, a striking enhancement of operation efficiency can be accomplished.

Moreover, by reducing the area of adhesive 2 and causing the adhesive to form a pattern of dense constituents, not only can the bleed-out of adhesive from the semiconductor chips be minimized but also a satisfactory amount of adhesive can be transferred.

Figure 4:
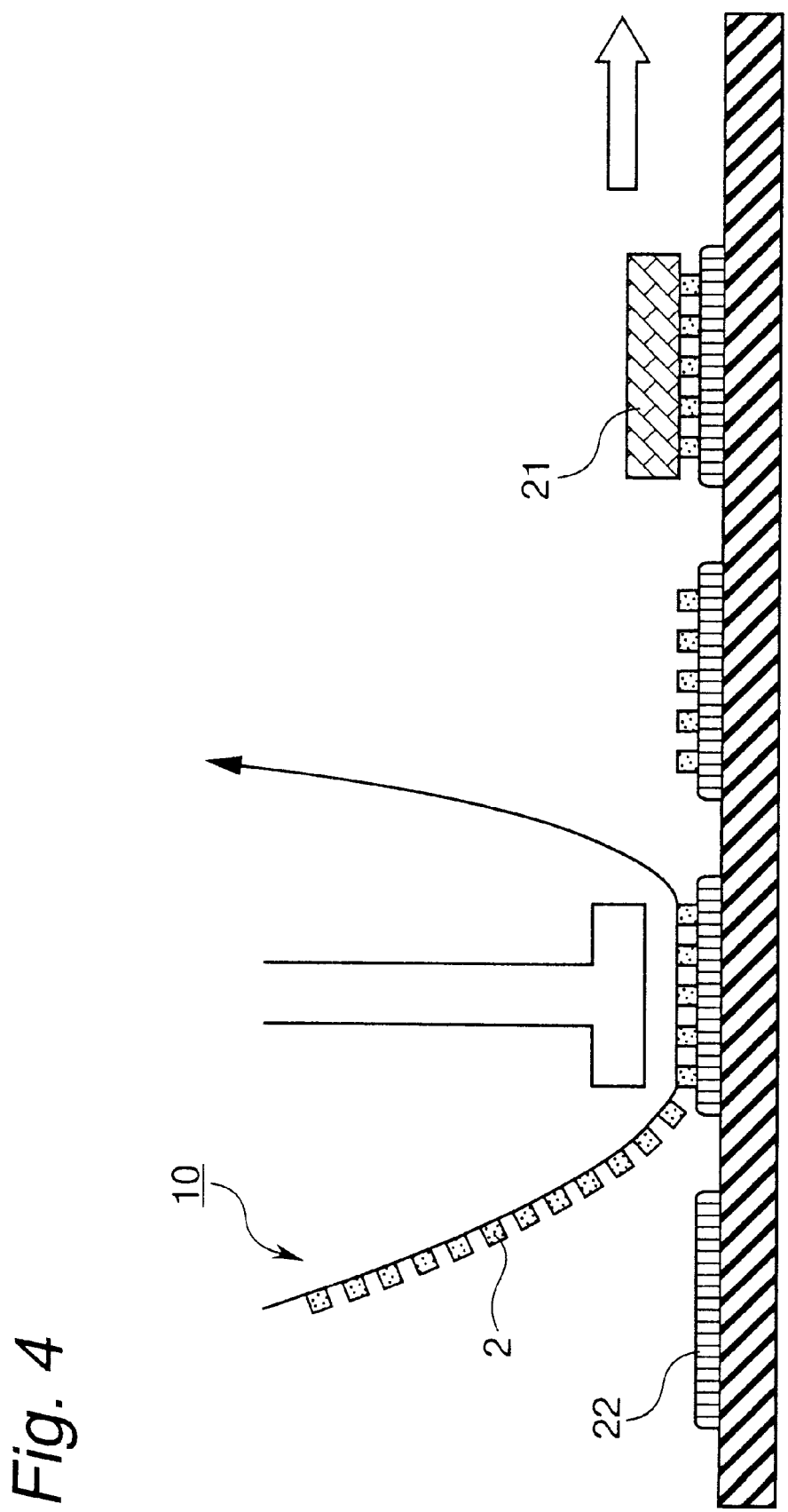
FIG. 4 shows major steps of the second method of securing semiconductor chips according to the present invention.

Furthermore, referring to FIG. 4, the transfer tape of the present invention can be used for transferring the adhesive to sites of a substrate as an object predetermined for securing semiconductor chips in advance.

Specifically, in the second method of securing semiconductor chips according to the present invention, the transfer tape 10 is stuck to sites 22 of a substrate predetermined for securing semiconductor chips. Next, the base material 1 of the transfer tape 10 is peeled with the result that the adhesive 2 is transferred onto the substrate sites 22 predetermined for securing semiconductor chips. Thereafter, semiconductor chips 21 are disposed on the transferred adhesive 2, and pressure is applied. As a result, the semiconductor chips 21 can be secured through the adhesive 2 onto the substrate.

As is apparent from the foregoing, the present invention provides a transfer tape which enables transferring a given amount of adhesive to an extremely small item such as a semiconductor chip or to portions of an extremely small area such as sites of a lead frame predetermined for mounting IC chips by simple operation.

EXAMPLE

The present invention will further be illustrated below with reference to the following Examples which in no way limit the scope of the invention.

Example 1

The release treatment side of a polyester film having its one side release-treated with an alkyd resin (surface tension of release-treated side: 33 dyne/cm$^2$, and thickness: 38 μm) was coated with a thermoplastic polyimide adhesive by screen printing so that the adhesive was arranged in the form of a pattern of independent circular constituents of 0.5 mm diameter and 20 μm thickness, these circular constituents being disposed with intervals (distance between neighboring circle centers: 0.7 mm, and shortest distance between neighboring circles: 0.2 mm). Thus, a desired transfer tape was obtained.

Subsequently, an IC chip of 3 mm×5 mm size at its underside was thermocompression-stuck to the side of the transfer tape provided with the adhesive in the form of a pattern of independent constituents at 130° C., and the polyester film was peeled. Thus, the adhesive was steadily transferred to the underside (back) of the chip. Thereafter, the IC chip was mounted through the adhesive on a lead frame and heated at 150° C. to thereby accomplish securing of the IC chip to the lead frame. There was no bleed-out of the adhesive.

The ratio (%) of the area per pattern constituent to the area of the underside of the object, i.e. IC chip, and the ratio (%) of the shortest distance between neighboring pattern constituents to the maximum length of the underside of the object are listed in Table 1 below.

Example 2

The same procedure as in Example 1 was repeated except that the size of the IC chip was changed to 25 mm×25 mm. The adhesive was transferred to the underside (back) of the IC chip as steadily as in Example 1. At the securing of the IC chip through the adhesive to a lead frame, there was no bleed-out of the adhesive.

Example 3

The same procedure as in Example 1 was repeated except that, with respect to the adhesive pattern, the diameter of independent pattern constituents, the distance between neighboring circle centers and the shortest distance between neighboring circles were changed to 1.3 mm, 1.8 mm and 0.5 mm, respectively. The adhesive was transferred to the underside (back) of the chip as steadily as in Example 1. At the securing of the IC chip through the adhesive to a lead frame, there was no bleed-out of the adhesive.

Example 4

The release treatment side of a polypropylene film having its one side release-treated with an alkyd resin (surface tension of release-treated side: 35 dyne/cm$^2$, and thickness: 40 $\mu$m) was coated with a hardenable pressure sensitive adhesive composition composed of an acrylic polymer, an epoxy resin and an epoxy curing agent by screen printing so that the hardenable pressure sensitive adhesive composition was arranged in the form of a pattern of independent square constituents of 0.5 mm side and 20 $\mu$m thickness, these square constituents disposed with intervals (distance between neighboring square centers: 0.9 mm, and shortest distance between neighboring squares: 0.4 mm). Thus, a desired transfer tape was obtained.

Subsequently, the side of the transfer tape provided with the hardenable pressure sensitive adhesive composition in the form of a pattern of independent constituents was compression-stuck to a site (3 mm×5 mm) of a lead frame (as a substrate) predetermined for mounting IC chip at room temperature, and the polypropylene film was peeled. Thus, the hardenable pressure sensitive adhesive composition was transferred to the lead frame. Thereafter, an IC chip was mounted on the transferred hardenable pressure sensitive adhesive composition and heated at 150° C. to thereby secure the IC chip to the lead frame. There was no bleed-out of the adhesive.

TABLE 1

| | $\dfrac{\text{area per pattern constituent}}{\text{area of underside of object}} \times 100(\%)$ | $\dfrac{\text{shortest distance between pattern constituents}}{\text{max. length of underside of object}} \times 100(\%)$ |
|---|---|---|
| Example 1 | 1.31 | 3.43 |
| Example 2 | 0.03 | 0.57 |
| Example 3 | 8.85 | 8.57 |
| Example 4 | 1.67 | 6.86 |

What is claimed is:

1. A method of securing semiconductor chips, comprising the steps of:
   providing a transfer tape comprising a base material and an adhesive superimposed upon the base material at spaced-apart intervals, wherein the adhesive is in the form of a pattern of independent constituents whose respective areas are substantially equal to each other, the area per pattern constituent is in the range of 0.01 to 10% of the area of an underside of a semiconductor chip onto which the adhesive is transferred, and an average shortest distance between pattern constituents is in the range of 0.5 to 10% of a maximum length of the semiconductor chip underside;
   sticking backs of semiconductor chips to the transfer tape;
   peeling the semiconductor chips from the transfer tape in such a manner that the adhesive is transferred onto the backs of the semiconductor chips; and
   securing the semiconductor chips through the adhesive onto a substrate.

2. A method of securing semiconductor chips, comprising the steps of:
   providing a transfer tape comprising a base material and an adhesive superimposed upon the base material at spaced-apart intervals, wherein the adhesive is in the form of a pattern of independent constituents whose respective areas are substantially equal to each other, the area per pattern constituent is in the range of 0.01 to 10% of the area of an underside of a semiconductor chip to be secured on a substrate, and an average shortest distance between pattern constituents is in the range of 0.5 to 10% of a maximum length of the semiconductor chip underside;
   sticking the transfer tape to sites of the substrate predetermined for securing semiconductor chips;
   peeling the base material of the transfer tape in such a manner that the adhesive is transferred onto the substrate sites predetermined for securing semiconductor chips; and securing semiconductor chips through the adhesive onto the substrate.

* * * * *

UNITED STATES PATENT AND TRADEMARK OFFICE
CERTIFICATE OF CORRECTION

PATENT NO.      : 6,544,371 B2
DATED           : April 8, 2003
INVENTOR(S)     : Hideo Senoo et al.

It is certified that error appears in the above-identified patent and that said Letters Patent is hereby corrected as shown below:

Column 1,
Line 21, "The" should read -- In the --.

Column 3,
Line 3, "of-common" should read -- of common --.

Signed and Sealed this

Twelfth Day of August, 2003

JAMES E. ROGAN
*Director of the United States Patent and Trademark Office*